US008525024B2

(12) United States Patent
Kaneda et al.

(10) Patent No.: US 8,525,024 B2
(45) Date of Patent: Sep. 3, 2013

(54) HERMETIC SEALING DEVICE AND HERMETIC SEALING STRUCTURE

(75) Inventors: Hiroaki Kaneda, Fujisawa (JP); Takeshi Yamada, Fujisawa (JP)

(73) Assignee: NOK Corporation, Tokyo (JP)

( * ) Notice: Subject to any disclaimer, the term of this patent is extended or adjusted under 35 U.S.C. 154(b) by 100 days.

(21) Appl. No.: 13/063,996

(22) PCT Filed: Sep. 30, 2009

(86) PCT No.: PCT/JP2009/067039

§ 371 (c)(1), (2), (4) Date: Mar. 15, 2011

(87) PCT Pub. No.: WO2010/038782

PCT Pub. Date: Apr. 8, 2010

(65) Prior Publication Data

US 2011/0162864 A1 Jul. 7, 2011

(30) Foreign Application Priority Data

Sep. 30, 2008 (JP) ................................ 2008-253566

(51) Int. Cl.

| | |
|---|---|
| ***H01J 5/00*** | (2006.01) |
| *H01J 15/00* | (2006.01) |
| *H05K 5/06* | (2006.01) |
| *H05K 9/00* | (2006.01) |
| *H05K 7/14* | (2006.01) |
| *H01L 23/02* | (2006.01) |

(52) U.S. Cl.

USPC .................... 174/50.5; 174/50.59; 174/50.61; 174/50.64; 174/386; 174/564; 361/816; 361/818; 361/796; 361/799; 361/800

(58) Field of Classification Search

CPC ................. H01J 5/32; H01J 5/40; H01J 5/42; H01J 2893/0034; H01J 2893/0035

USPC ........... 174/50.59, 50.61, 50.5, 50.51, 50.56, 174/50.63, 50.64, 385, 386, 564; 361/816, 361/818, 796, 799, 800

See application file for complete search history.

(56) References Cited

U.S. PATENT DOCUMENTS

| | | | | |
|---|---|---|---|---|
| 6,160,685 | A * | 12/2000 | Hamilton | 360/246.2 |
| 8,003,898 | B2 * | 8/2011 | Hayashi et al. | 174/385 |
| 2006/0153669 | A1 * | 7/2006 | Miller et al. | 414/800 |
| 2006/0158865 | A1 * | 7/2006 | Ohmi et al. | 361/795 |
| 2009/0250261 | A1 * | 10/2009 | Hayashi et al. | 174/377 |

FOREIGN PATENT DOCUMENTS

| | | |
|---|---|---|
| JP | 2003-120811 | 4/2003 |
| JP | 2003-262274 | 9/2003 |
| JP | 2008-109107 | 5/2008 |
| JP | EP-2068607 | 6/2009 |

OTHER PUBLICATIONS

International Search Report for PCT/JP2009/067039, ISA/JP, mailed Dec. 15, 2009 (2 pages).

* cited by examiner

*Primary Examiner* — Hoa C Nguyen

(74) *Attorney, Agent, or Firm* — Harness, Dickey & Pierce, P.L.C.

(57) ABSTRACT

A hermetically sealing device includes a conductive seal member (2) which is integrated with a conductive member (1) extending into a casing (3) and seals a space between the conductive member (1) and an inserting section for the conductive member (1) on the casing (3). In the conductive member (1), an electromagnetic wave shield layer (11) is laminated on a cover film which protects the surface of a base film having a circuit pattern, an insulating layer (12) is laminated on the electromagnetic wave shield layer (11), the insulating layer (12) has an opening section (12*a*) such that a part of the flat section of the electromagnetic wave shield layer (11) is exposed, and the seal member (2) is integrated with the conductive member (1) to cover the opening section (12*a*) and is brought into contact with the electromagnetic wave shield layer (11) through the opening section (12*a*).

3 Claims, 12 Drawing Sheets

3
2
12a
1
12
11
10
11
12
12a

HERMETIC SEALING DEVICE AND HERMETIC SEALING STRUCTURE

TECHNICAL FIELD

The present invention relates to a hermetic sealing device and a hermetic sealing structure wherein a sealing member having an electric conductivity is integrally formed in a flat and flexible electrically conductive member.

BACKGROUND ART

Any electronic devices loaded in automobiles, located outdoors, or used in a dusty environment need to be equipped with sealing components, such as gasket or grommet, which prevent ingress of water or dust from outside. These sealing components are provided to seal, for example, a gap between a cover portion and a body of a casing, a gap between a casing and a wiring unit such as a power supply line, or a gap between a plurality of casings joined with each other. Further, there is a prospect that an FPC (flexible printed circuit board) will be more often used in the wiring unit as automobiles and electronic devices are more space-saving and reduced in weight. In order to seal any section where the FPC is used, the sealing component is formed integral with the FPC to ensure a sealing performance in the wiring unit.

In the meantime, the EMC (electromagnetic compatibility) regulations for electronic devices are becoming more demanding in different industrial fields in recent years, which requires some overall measure for EMC compliance in circuit, casing and system. An effective EMC-compliant measure in casing is an electromagnetic wave shield which blocks radiation and penetration of electromagnetic waves. When any sealing component which is not electrically conductive is used, however, an electrical gap is generated where the sealing component is attached, and there is no way to avoid electromagnetic waves that may radiate and penetrate through the gap.

According to the invention disclosed in the Patent Document 1, a gasket which seals joined surfaces of a casing cover and a casing body is electrically conducted to provide an electric connection between the casing cover and the casing body so that an electromagnetic wave shield is formed across the casing. This technique, however, fails to form an expected electric connection between the casing and the electromagnetic wave shield layer of FPC because the surface of the electromagnetic wave shield layer of FPC drawn out of the casing is covered with a protective film formed to provide surface protection and electrical insulation. As a result, it may fail to substantially shield the electromagnetic waves because the shield layer possibly serves as an antenna, causing incident radiation of electromagnetic waves.

PRIOR ART DOCUMENT

Patent Document

Patent Document 1: Japanese Patent Application Laid-Open No. 2003-262274

DISCLOSURE OF THE INVENTION

Problems to be Solved by the Invention

The present invention was accomplished to solve the conventional technical problem, and provides a hermetic sealing device and a hermetic sealing structure in which an electromagnetic wave shielding performance is improved.

Means for Solving the Problems

In order to achieve the above object, there is provided a hermetic sealing device according to the present invention, including a sealing member formed integral with a flat and flexible electrically conductive member pulled out from inside of a casing, the sealing member further having an electric conductivity and sealing a gap between the electrically conductive member and an insertion section for the electrically conductive member on the casing, wherein the electrically conductive member has a structure where an electromagnetic wave shield layer is formed on a protective layer which protects a surface of a base layer provided with a wiring, an insulation layer is formed on the electromagnetic wave shield layer, and the insulation layer has an opening section which partly exposes a planar portion of the electromagnetic wave shield layer, and the sealing member is formed integral with the electrically conductive member so as to cover the opening section and makes a contact with the electromagnetic wave shield layer through the opening section.

Further, in order to achieve the above object, there is provided a hermetic sealing structure according to the present invention, including a flat and flexible electrically conductive member, a casing having an insertion section through which the electrically conductive member is inserted, and a sealing member having an electric conductivity and sealing a gap between the electrically conductive member and the insertion section, wherein the electrically conductive member has a structure where an electromagnetic wave shield layer is formed on a protective layer which protects a surface of a base layer provided with a wiring, an insulation layer is formed on the electromagnetic wave shield layer, and the insulation layer has an opening section which partly exposes a planar portion of the electromagnetic wave shield layer, and the sealing member is formed integral with the electrically conductive member so as to cover the opening section and makes a contact with the electromagnetic wave shield layer through the opening section.

Further, in order to achieve the object, there is provided a hermetic sealing structure according to the present invention, including a flat and flexible electrically conductive member, a casing including a cover portion and a body joined with the cover portion, and an electrically conductive sealing member attached to joined surfaces of the cover portion and the body to seal the joined surfaces, the sealing member being provided with an insertion section used to pull out the electrically conductive member from inside of the casing, wherein the electrically conductive member has a structure where an electromagnetic wave shield layer is formed on a protective layer which protects a surface of a base layer provided with a wiring, an insulation layer is formed on the electromagnetic wave shield layer, and the insulation layer has an opening section which partly exposes a planar portion of the electromagnetic wave shield layer, and the sealing member is formed integral with the electrically conductive member so as to cover the opening section and makes a contact with the electromagnetic wave shield layer through the opening section.

According to the structure described thus far, wherein the opening section is formed in the insulation layer which protects the electromagnetic wave shield layer so that a part of a planar portion of the electromagnetic wave shield layer contacts the sealing member, an electrical gap between the electromagnetic wave shield layer of the electrically conductive member and the casing can be lessened. As a result, the electromagnetic wave shield can be formed so as to cover all of the casing with less electrical gap and the electrically conductive member, and radiation and penetration of electromagnetic waves through the sealed portion can be thereby more effectively blocked.

Effect of the Invention

As described so far, the present invention can improve an electromagnetic sealing performance.

MODES FOR CARRYING OUT THE INVENTION

Figure 1A:
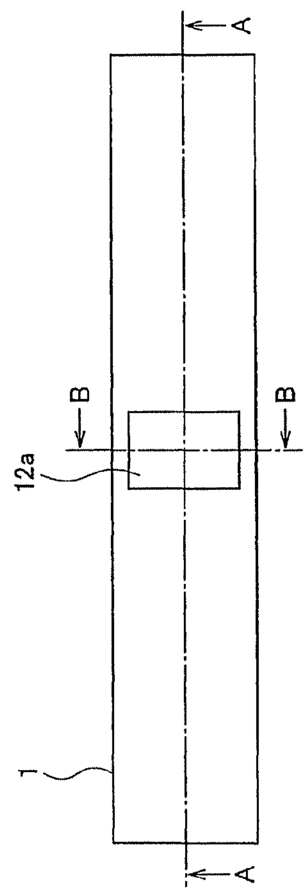
FIG. 1A is a planar view of an electrically conductive member according to an exemplary embodiment 1 of the present invention, schematically illustrating a structure of the electrically conductive member.

Hereinafter, illustrative examples of the present invention are described in further detail based on exemplary embodiments referring to the drawings. Unless particularly specified in the following description, the scope of the present invention is not limited to dimensions, materials, shapes and relative locations of structural elements recited in the exemplary embodiments.

Exemplary Embodiment 1

Figure 1B:
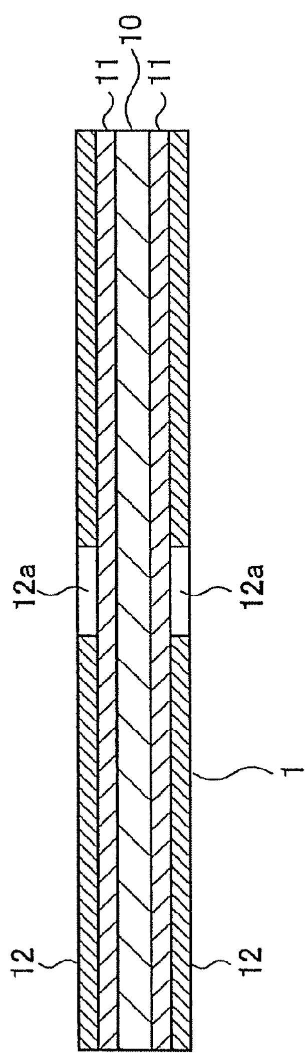
FIG. 1B is a sectional view of the illustration of FIG. 1A cut along A-A, schematically illustrating the structure of the electrically conductive member according to the exemplary embodiment 1.
Figure 1C:
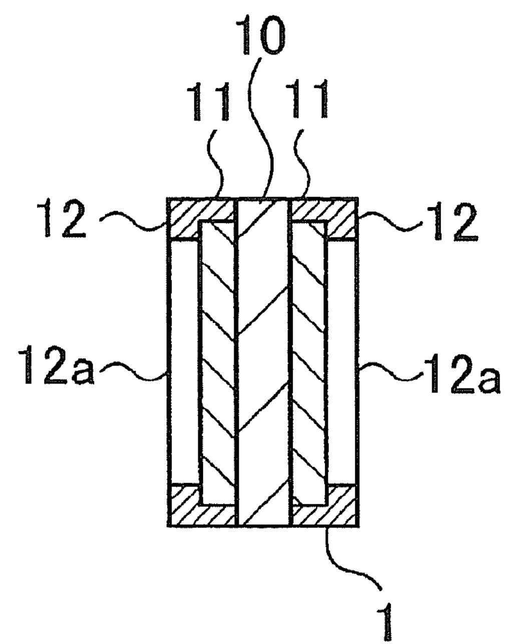
FIG. 1C is a sectional view of the illustration of FIG. 1A cut along B-B, schematically illustrating the structure of the electrically conductive member according to the exemplary embodiment 1.
Figure 2A:
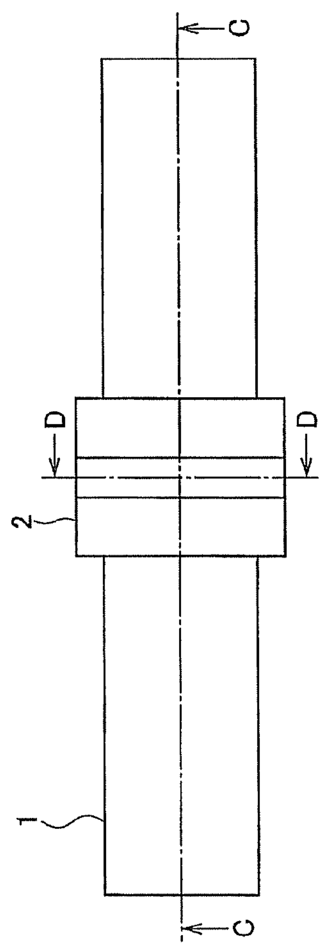
FIG. 2A is a planar view of the electrically conductive member and a sealing member, schematically illustrating a structure of a hermetic sealing device according to the exemplary embodiment 1.
Figure 2B:
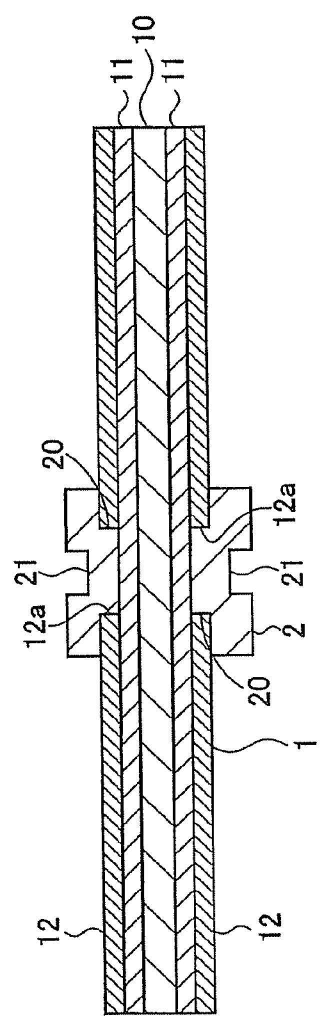
FIG. 2B is a sectional view of the illustration of FIG. 2A cut along C-C, schematically illustrating the structure of the hermetic sealing device according to the exemplary embodiment 1.
Figure 2C:
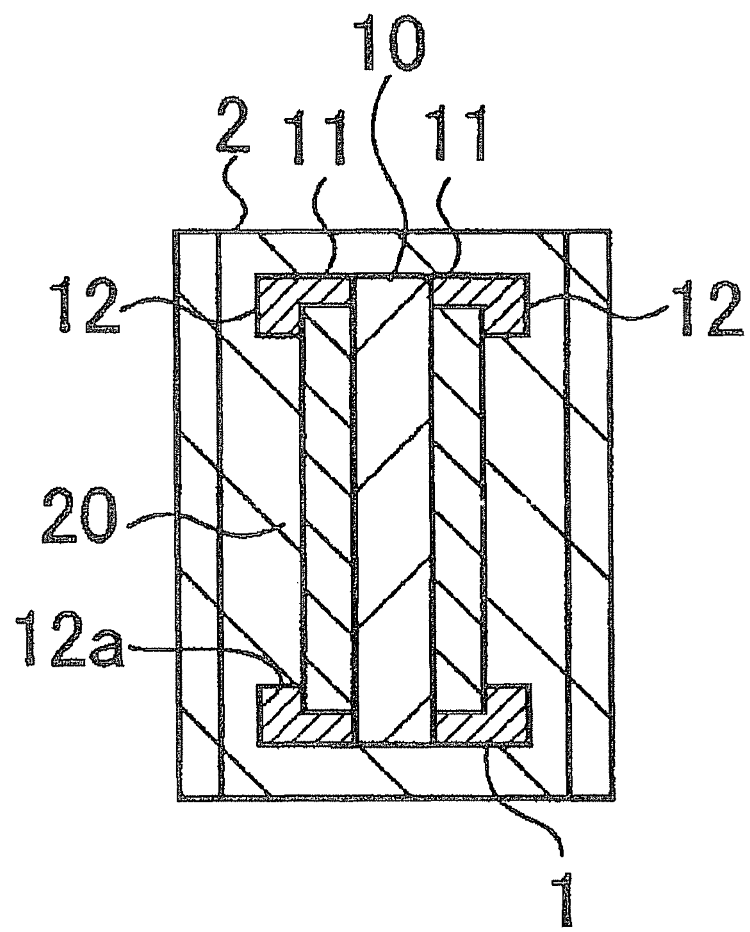
FIG. 2C is a sectional view of the illustration of FIG. 2A cut along D-D, schematically illustrating the structure of the hermetic sealing device according to the exemplary embodiment 1.
Figure 3:
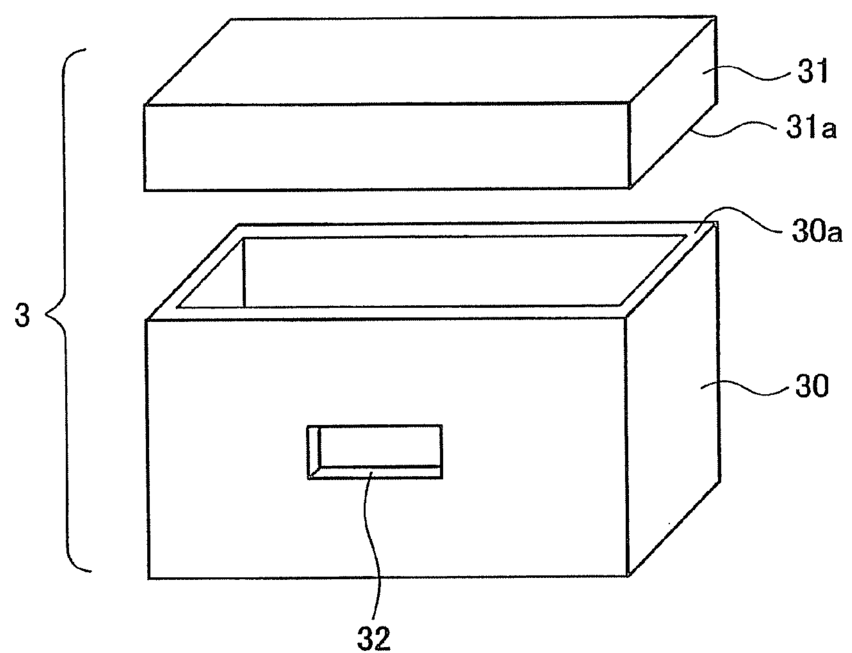
FIG. 3 is an exploded perspective view, schematically illustrating a structure of a casing.
Figure 4:
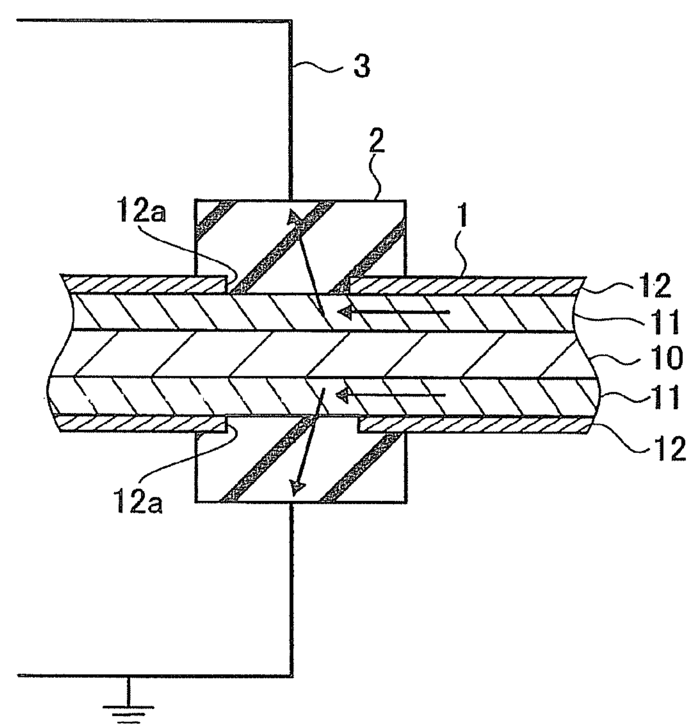
FIG. 4 is a sectional view, schematically illustrating a hermetic sealing structure according to the exemplary embodiment 1.

Referring to FIGS. 1A to 4, a hermetic sealing structure according to an exemplary embodiment 1 of the present invention is described below. FIG. 1 are schematic illustrations of a structure of an electrically conductive member. FIG. 1A is a planar view of the electrically conductive member, FIG. 1B is a sectional view of the electrically conductive member cut along A-A in FIG. 1A, and FIG. 10 is a sectional view of the electrically conductive member cut along B-B in FIG. 1A. FIG. 2 are schematic illustrations of the electrically conductive member where a sealing member is integrally formed. FIG. 2A is a planar view of the electrically conductive member and the sealing member, FIG. 2B is a sectional view of the electrically conductive member and the sealing member cut along C-C in FIG. 2A, and FIG. 2C is a sectional view of the electrically conductive member and the sealing member cut along D-D in FIG. 2A. FIG. 3 is an exploded perspective view, schematically illustrating a structure of a casing. FIG. 4 is a sectional view, schematically illustrating the schematic sealing structure according to the exemplary embodiment 1.

<Structure of Electrically Conductive Member>

As illustrated in FIGS. 1A to 1C, an electrically conductive member 1 has a structure where an electromagnetic wave shield layer 11 and an insulation layer 12 are multilayered on both surfaces of a FPC 10. The electrically conductive member (FPC) 1 is a flexible member formed in the shape of a band generally flat.

In the FPC 10, a cover film made of a material such as polyimide, polyamide, polyester, liquid crystal polymer, or polyethylene naphthalate is bonded to both surfaces of a base film made of the same material, and a circuit pattern formed by a copper foil is sandwiched between the base film and the cover film.

The electromagnetic wave shield layer 11 is made of silver paste and formed on outer sides of the cover film of the FPC 10.

The insulation layer 12 is a protective film made of alkyd resin, generally called topcoat. The insulation layer 12 is formed to provide surface protection and electrical insulation to the electromagnetic wave shield layer 11. The insulation layer 12 has an opening section 12*a* formed to expose a part of an upper surface (planar portion) of the electromagnetic wave shield layer 11.

As illustrated in FIG. 1C, the electromagnetic wave shield layer 11 is formed in a width smaller than that of the FPC 10, and all of the electromagnetic wave shield layer 11 but the opening section 12*a* is completely covered with the insulation layer 12. The electromagnetic wave shield layer 11 and the insulation layer 12 are not necessarily provided on both of the surfaces of the FPC 10 as described in the present exemplary embodiment but may be provided on just one surface thereof.

<Structure of Sealing Member>

As illustrated in FIGS. 2A to 2C, the sealing member 2 is provided so as to encompass apart of the electrically conductive member 1 throughout its circumference in a direction orthogonal to the longitudinal direction of the electrically conductive member 1. The opening section 12*a* of the insulation layer 12 is formed at such a position that can be completely covered with the sealing member 2.

The sealing member 2 according to the present exemplary embodiment is a grommet made of electrically conductive rubber or resin. The sealing member 2 seals a gap between the electrically conductive member 1 and an insertion hole (insertion section) 32 formed to pull out the electrically conductive member 1 from the casing 3 illustrated in FIG. 3.

The sealing member 2 can be formed integral with the electrically conductive member 1 by employing such a process as compression molding in which solid electrically conductive rubber is used or injection molding in which electrically conductive resin material in liquid form is used. The sealing member 2 may be molded in advance and then attached to the electrically conductive member 1 to be integral therewith. To mold the sealing member 2, any processing technique suitable for characteristics of the resin or rubber used therein can be employed. A die used to mold the grommet can be inexpensively produced because no process requiring special device is necessary.

The sealing member 2 has a protruding section 20 adapted to the opening section 12*a* of the insulation layer. The protruding section 20 makes a contact with the electromagnetic wave shield layer 11 through the opening section 12*a*.

The upper surface of the sealing member 2 is provided with a groove 21 narrower than the opening section 12 and extending in the transverse direction of the electrically conductive member 1. The groove 21 has such a shape that an opening edge of the insertion hole 32 is fitted thereto when the sealing member 2 is mounted between the electrically conductive member 1 and the insertion hole 32. Further, the groove 21 is formed so that its position in the longitudinal direction of the electrically conductive member 1 stays within the dimensional range of the opening section 12*a*.

The formation of the groove 21 thus structurally characterized makes the protruding section 20 and the opening section 12*a* more closely fitted to each other, thereby improving a sealing performance. Between the protruding section 20 and the opening section 12*a* is possibly formed a gap generated from a dimensional difference due to post-cure shrinkage in the case of integral molding or some dimensional error in the case of post-molding mounting. However, even though such gap is generated, when the opening edge of the insertion hole 32 is fitted to the groove 21, the protruding section 20 of the sealing member 2 is deformed, expanding in the longitudinal direction of the electrically conductive member 1, so that the deformed protruding section 20 fills in such a gap. When the gap is thus closed, an expected contact area between the sealing member 2 and the electromagnetic wave shield layer 11 can be ensured.

<Structure of Hermetic Sealing Structure>

When the electrically conductive member 1 is inserted through the insertion hole 32 of the casing 3, and the sealing member 2 is mounted between the insertion hole 32 and the electrically conductive member 1 as illustrated in FIG. 4, the casing 3 and the electromagnetic wave shield layer 11 of the electrically conductive member 1 are electrically connected to each other by the sealing member 2 interposed therebetween.

The sealing member 2 directly contacts the electromagnetic wave shield layer 11 through the opening section 12*a* of the insulation layer 12 so that an electrical gap between the casing 3 and the electromagnetic wave shield layer 11 of the electrically conductive member 1 can be lessened.

Figure 6:
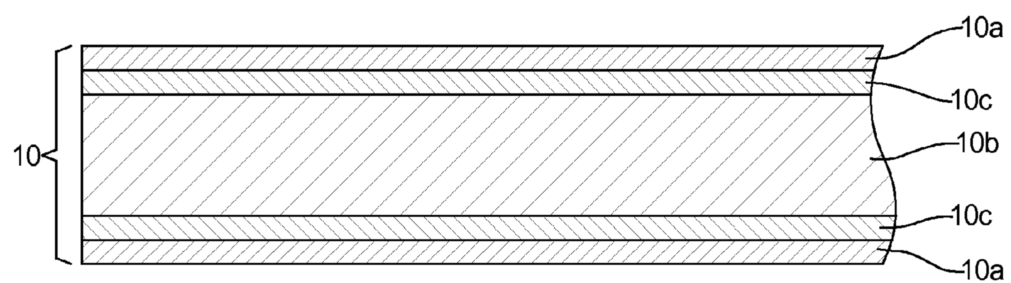
FIG. 6 is a schematic cross-section of the flexible printed circuit board.

In the FPC 10, as illustrated in FIG. 6, a cover film 10*a* made of a material such as polyimide, polyamide, polyester, liquid crystal polymer, or polyethylene naphthalate is bonded to both surfaces of a base film 10*b* made of the same material, and a circuit pattern 10*c* formed by a copper foil is sandwiched between the base film 10*b* and the cover film 10*a*.

A ground line of the FPC 10 may be connected to the electromagnetic wave shield layer 11, wherein the ground line and the casing 3 are electrically connected to each other. Thus, an electrical connection can be easily provided between the ground line and the casing 3.

Exemplary Embodiment 2

Figure 5A:
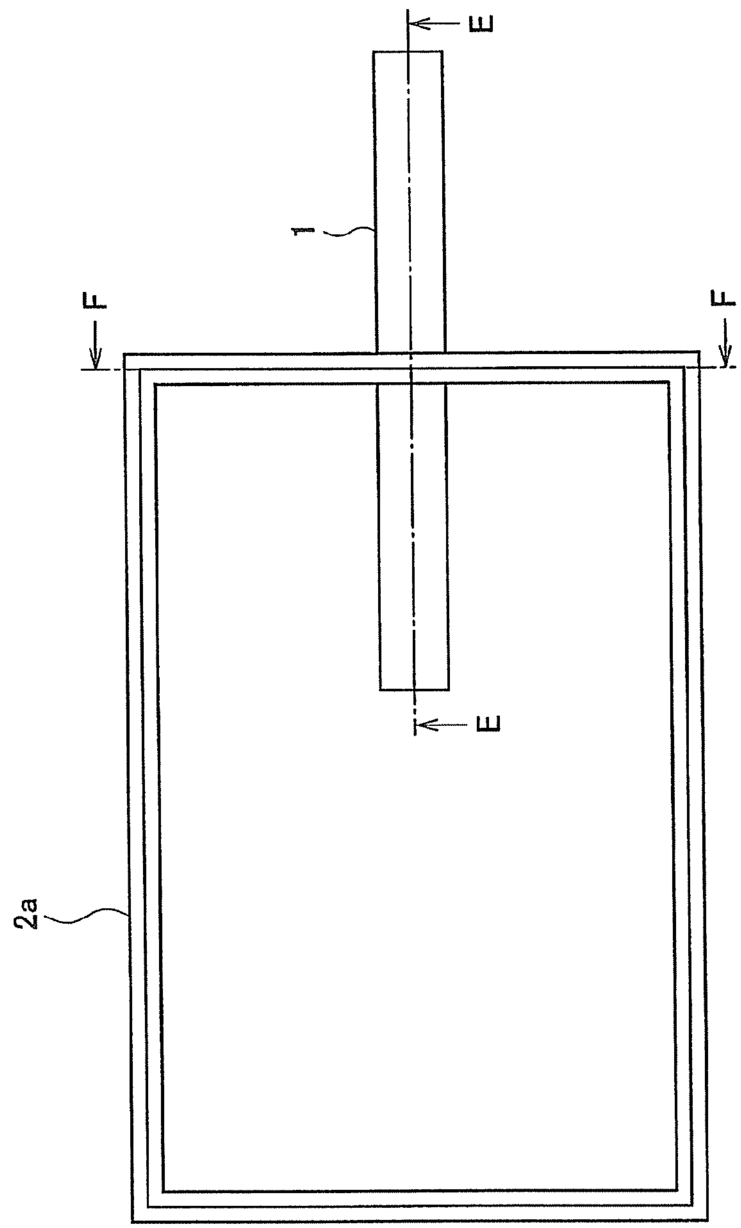
FIG. 5A is a planar view of an electrically conductive member and a sealing member, schematically illustrating a structure of a hermetic sealing device according to an exemplary embodiment 2 of the present invention.
Figure 5B:
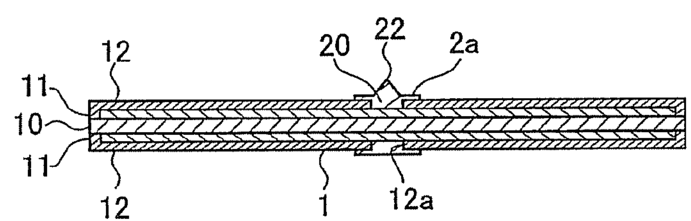
FIG. 5B is a sectional view of the illustration of FIG. 5A cut along E-E, schematically illustrating the structure of the hermetic sealing device according to the exemplary embodiment 2.
Figure 5C:
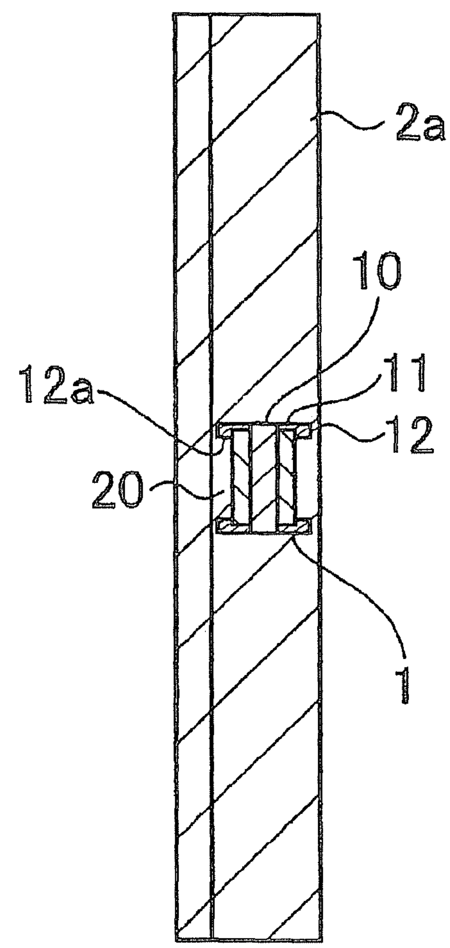
FIG. 5C is a sectional view of the illustration of FIG. 5A cut along F-F, schematically illustrating the structure of the hermetic sealing device according to the exemplary embodiment 2.

Referring to FIG. 5, a hermetic sealing device and a hermetic sealing structure according to an exemplary embodiment 2 of the present invention are described below. FIG. 5 are schematic illustrations of an electrically conductive member where a sealing member is integrally formed. FIG. 5A is a planar view of the electrically conductive member and the sealing member, FIG. 5B is a sectional view of the illustration of FIG. 5A cut along E-E, and FIG. 5C is a sectional view of the illustration of FIG. 5A cut along F-F. Any elements structurally similar to those according to the exemplary embodiment 1 are simply illustrated with the same reference symbols and will not be described again.

A sealing member provided in the hermetic sealing device according to the exemplary embodiment 2 has a structural characteristic different from that of the sealing member according to the exemplary embodiment 1. A sealing member 2*a* according to the exemplary embodiment 2 is a gasket made of electrically conductive rubber or resin. The gasket is closely interposed between joined surfaces 30*a* and 31*a* between a casing body 30 and a cover portion 31 of the casing 3 illustrated in FIG. 3 to seal any space between the casing body 30 and the cover portion 31. The gasket is also used to form an insertion section through which the electrically conductive member 1 in the casing is pulled out therefrom.

Similarly to the sealing member 2 according to the exemplary embodiment 1, the sealing member 2*a* can be formed integral with the electrically conductive member 1 by employing such a process as compression molding in which solid electrically conductive rubber is used or injection molding in which electrically conductive rubber material in liquid form is used. The sealing member 2*a* may be molded in advance and then attached to the electrically conductive member 1 to be integral therewith.

The upper surface of the sealing member 2*a* (surface joined with the casing body 30 or the cover portion 31) is provided with a bead section 22 protruding in a direction where the sealing member 2*a* is joined with the casing body 30 or the cover portion 31. The bead section 22 is provided throughout the circumference of the upper surface to be compressed when the sealing member 2*a* is joined with the casing body 30 or the cover portion 31. The bead section 22 thus compressed can enhance the sealing performance. The bead section 22 is provided to extend in the range in which the opening section 12*a* is provided.

The formation of the bead section 22 thus structurally characterized makes the protruding section 20 and the opening section 12*a* more closely fitted to each other, thereby improving the sealing performance. Between the protruding section 20 and the opening section 12*a* is possibly formed a gap generated from a dimensional difference due to post-cure shrinkage in the case of integral molding or some dimensional error in the case of post-molding mounting. However, even though such gap is generated, when the bead section 22 is thus compressed, the protruding section 20 of the sealing member 2*a* is deformed, expanding in the longitudinal direction of the electrically conductive member 1, so that the deformed protruding section 20 fills in such a gap. When the gap is thus closed, an expected contact area between the sealing member 2*a* and the electromagnetic wave shield layer 11 can be ensured.

The hermetic sealing structure according to the present exemplary embodiment will not be described since it has a structure similar to that of the hermetic sealing structure according to the exemplary embodiment 1.

Working Example 1

The present invention is further described referring to a working example.

In a working example of the present invention, a grommet was formed, in which electrically conductive rubber was integrally formed in an FPC having the width of 30 mm, length of 300 mm, and thickness of 0.15 mm. An electromagnetic wave shield layer of the FPC was exposed on both surfaces thereof by the width of 26 mm and the length of 6 mm, and a ground line was connected to the electromagnetic wave shield layer. The shape of the grommet was decided based on the shape illustrated in FIGS. 2A to 2C. A grommet insertion hole of a metallic casing had the dimension of 40×10 mm, and a fastening margin width of a sealed portion was 0.3 mm.

The FPC was set in a die formed based on the described shape, and solid electrically conductive rubber was compressed and molded so that the rubber and the FPC were integrally formed. Though a process to be employed depends on the type of rubber used, the FPC and the rubber are conventionally formed integral with each other by vulcanizing for approximately 2 to 10 minutes at approximately 130 to 180° C. After the molding is completed, any burred portion was removed. The grommet integral with the FPC was thus formed.

The grommet thus produced was inserted through a grommet insertion hole 32 of a metallic casing 3 illustrated in FIG. 4 so that a radiation electromagnetic field generated from inside of the metallic casing was measured. A difference from a radiation electric field intensity when a non-electrically conductive grommet is provided was determined as representing a shielding performance. The shielding performance thus obtained was 30 to 40 dB, which confirmed an electromagnetic wave shielding performance. Further, a resistance value between the ground line and the casing was measured. The obtained resistance value was a few Ω, which confirmed an electrical connection between the shield layer of the FPC and the ground line.

EXPLANATIONS OF REFERENCE NUMERALS

1 electrically conductive member
10 FPC
11 electromagnetic wave shield layer
12 insulation layer
12*a* opening section
2 sealing member
20 protruding section
21 groove
3 casing

The invention claimed is:

1. A hermetic sealing device, comprising a sealing member formed integral with a flat and flexible electrically conductive member pulled out from inside of a casing, the sealing member further having an electric conductivity and sealing a gap between the electrically conductive member and an insertion section for the electrically conductive member on the casing, wherein the electrically conductive member has a structure where an electromagnetic wave shield layer is formed on a cover film which protects a surface of a base film provided with a circuit pattern, an insulation layer is formed on the electromagnetic wave shield layer, and the insulation layer has an opening section which partly exposes a planar portion of the electromagnetic wave shield layer, and the sealing member is formed integral with the electrically conductive member so as to cover the opening section and makes a contact with the electromagnetic wave shield layer through the opening section.

2. A hermetic sealing structure, comprising:

a flat and flexible electrically conductive member;

a casing having an insertion section through which the electrically conductive member is inserted; and a sealing member having an electric conductivity and sealing a gap between the electrically conductive member and the insertion section, wherein the electrically conductive member has a structure where an electromagnetic wave shield layer is formed on a cover film which protects a surface of a base film provided with a circuit pattern, an insulation layer is formed on the electromagnetic wave shield layer, and the insulation layer has an opening section which partly exposes a planar portion of the electromagnetic wave shield layer, and the sealing member is formed integral with the electrically conductive member so as to cover the opening section and makes a contact with the electromagnetic wave shield layer through the opening section.

3. A hermetic sealing structure, comprising:

a flat and flexible electrically conductive member;

a casing including a cover portion and a body joined with the cover portion; and an electrically conductive sealing member attached to joined surfaces of the cover portion and the body to seal the joined surfaces, the sealing member being provided with an insertion section used to pull out the electrically conductive member from inside of the casing, wherein the electrically conductive member has a structure where an electromagnetic wave shield layer is formed on a cover film which protects a surface of a base film provided with a circuit pattern, an insulation layer is formed on the electromagnetic wave shield layer, and the insulation layer has an opening section which partly exposes a planar portion of the electromagnetic wave shield layer, and the sealing member is formed integral with the electrically conductive member so as to cover the opening section and makes a contact with the electromagnetic wave shield layer through the opening section.

* * * * *